(12) United States Patent
Vielemeyer et al.

(10) Patent No.: US 9,799,643 B2
(45) Date of Patent: Oct. 24, 2017

(54) GATE VOLTAGE CONTROL FOR III-NITRIDE TRANSISTORS

(71) Applicant: Infineon Technologies Austria AG, Villach (AT)

(72) Inventors: Martin Vielemeyer, Villach (AT); Walter Rieger, Arnoldstein (AT); Martin Pölzl, Ossiach (AT); Gerhard Nöbauer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 80 days.

(21) Appl. No.: 13/901,183

(22) Filed: May 23, 2013

(65) Prior Publication Data
US 2014/0346569 A1    Nov. 27, 2014

(51) Int. Cl.
*H01L 27/02*    (2006.01)
*H01L 21/8252*    (2006.01)
(Continued)

(52) U.S. Cl.
CPC ...... *H01L 27/0281* (2013.01); *H01L 21/8252* (2013.01); *H01L 27/0605* (2013.01); *H01L 27/088* (2013.01)

(58) Field of Classification Search
CPC ........... H01L 29/2003; H01L 29/66462; H01L 29/7786; H01L 29/778
See application file for complete search history.

(56) References Cited

U.S. PATENT DOCUMENTS 6,583,663 B1    6/2003 Disney
6,806,533 B2    10/2004 Henninger et al.
(Continued)

FOREIGN PATENT DOCUMENTS

CN    101179226 A    5/2008
CN    101442302 A    5/2009
(Continued)

OTHER PUBLICATIONS

Yang et al. "NexFET Generation 2, New Way to Power." IEEE International Electron Devices Meeting (IEDM), Dec. 2011. pp. 26.1.1-26.1.4.
(Continued)

*Primary Examiner* — Marcos D Pizarro
*Assistant Examiner* — Quinton Brasfield
(74) *Attorney, Agent, or Firm* — Murphy, Bilak & Homiller, PLLC

(57) ABSTRACT

A semiconductor die includes a III-nitride semiconductor substrate, a power HEMT (high-electron-mobility transistor) disposed in the III-nitride semiconductor substrate, and a first gate driver HEMT monolithically integrated with the power HEMT in the III-nitride semiconductor substrate. The power HEMT and the first gate driver HEMT each have a gate, a source and a drain. The first gate driver HEMT logically forms part of a driver, and is electrically connected to the gate of the power HEMT. The first gate driver HEMT is operable to turn the power HEMT off or on responsive to an externally-generated control signal received from the driver or other device. Additional embodiments of semiconductor dies and methods of manufacturing are also described.

15 Claims, 7 Drawing Sheets

(51) Int. Cl.
*H01L 27/06* (2006.01)
*H01L 27/088* (2006.01)

(56) References Cited

U.S. PATENT DOCUMENTS

| | | | |
|---|---|---|---|
| 7,449,777 | B2 | 11/2008 | Deboy et al. |
| 7,495,419 | B1 | 2/2009 | Ju |
| 8,193,559 | B2 | 6/2012 | Haeberlen et al. |
| 2005/0173741 | A1 | 8/2005 | Spring |
| 2006/0055384 | A1 | 3/2006 | Jordan et al. |
| 2006/0273768 | A1 | 12/2006 | Chen et al. |
| 2009/0065810 | A1* | 3/2009 | Honea ............. H01L 27/0605 257/192 |
| 2010/0066322 | A1 | 3/2010 | Buethker |
| 2010/0327942 | A1 | 12/2010 | Deboy |
| 2011/0074375 | A1* | 3/2011 | Yang ................ H02M 3/1588 323/282 |
| 2011/0148506 | A1 | 6/2011 | Korec et al. |
| 2011/0241170 | A1 | 10/2011 | Haeberlen et al. |
| 2011/0284869 | A1* | 11/2011 | Briere ............... H01L 29/045 257/76 |
| 2012/0127767 | A1* | 5/2012 | Spits ............... H03K 19/09407 257/392 |
| 2012/0268091 | A1* | 10/2012 | Takemae ............ H03K 17/164 323/272 |
| 2013/0033243 | A1* | 2/2013 | Takemae ............... 323/271 |
| 2014/0049296 | A1* | 2/2014 | Jeon et al. ............... 327/109 |
| 2014/0203288 | A1* | 7/2014 | Hsiung ............. H01L 29/7787 257/76 |

FOREIGN PATENT DOCUMENTS

| | | |
|---|---|---|
| CN | 102184926 A | 9/2011 |
| CN | 102545559 A | 7/2012 |
| DE | 10214151 B4 | 4/2007 |
| DE | 102008056206 A1 | 5/2009 |

OTHER PUBLICATIONS

Yang, Boyi et al., "Design Considerations on Low Voltage Synchronous Power MOSFETs with Monolithically Integrated Gate Voltage Pull-down Circuitry", Proceedings of the 2012 24$^{th}$ International Symposium on Power Semiconductor Devices and ICs, Jun. 2012, pp. 121-124.

* cited by examiner

US 9,799,643 B2

GATE VOLTAGE CONTROL FOR III-NITRIDE TRANSISTORS

TECHNICAL FIELD

The instant application relates to III-nitride transistors, and more particularly to controlling the gate voltage of III-nitride transistors.

BACKGROUND

Buck converters are widely used for DC-DC conversion, and preferably have high efficiency. To achieve high efficiency, the high-side and low-side power transistors of a buck converter output stage must be switched very fast and use as little margin (i.e. dead time) as possible. However, when switching very quickly, a voltage is induced on the gate of at least one of the power transistors. Such an induced gate voltage leads to a turn-on of the device, cross-conduction, and very high losses unless the dead time is set long enough to avoid these conditions.

Power HEMTs (high-electron-mobility transistors) theoretically provide significant power density, on-state resistance, switching frequency, and efficiency benefits over silicon MOSFETs in DC-DC converters, but pose new challenges for designers. For example, buck converters are typically packaged with the power transistors of the output stage disposed in one or more dies (chips) and the driver for the output stage on a separate die. With such an arrangement, the inductance between the driver and the gate of the output stage power transistors is so high that the gate voltage cannot be perfectly controlled due to the dynamic voltage drop over the series parasitic resistance and inductance. This, in turn, causes voltage spikes at the gate of the power transistors unless the dead time is increased, which, in turn, reduces efficiency. If left unmitigated, such voltage spikes preclude the use of HEMTs in power converters because conventional HEMTs are much more susceptible to gate voltage spikes than silicon MOSFETs.

SUMMARY

The embodiments described herein monolithically integrate at least part of a gate driver with a power HEMT on the same die, with other parts of the gate driver being disposed on a separate die. The part of the gate driver monolithically integrated with the power HEMT on the same die can be removed from the driver die, eliminating much of the parasitic resistance and inductance between the dies and, therefore, reducing voltage spikes at the gate of the power HEMT. The power HEMT can be used in various types of circuits, including DC-DC converters such as buck converters.

According to an embodiment of a semiconductor die, the semiconductor die comprises a III-nitride semiconductor substrate, a power HEMT (high-electron-mobility transistor) disposed in the III-nitride semiconductor substrate, and a first gate driver HEMT monolithically integrated with the power HEMT in the III-nitride semiconductor substrate. The power HEMT and the first gate driver HEMT each have a gate, a source, and a drain. The first gate driver HEMT logically forms part of a driver, and is electrically connected to the gate of the power HEMT. The first gate driver HEMT is operable to turn the power HEMT off or on responsive to an externally-generated control signal received from the driver or other device.

According to an embodiment of a method of manufacturing the semiconductor die, the method comprises: forming the power HEMT in the III-nitride semiconductor substrate, the power HEMT having a gate, a source, and a drain; monolithically integrating the first gate driver HEMT with the power HEMT in the III-nitride semiconductor substrate, the first gate driver HEMT having a gate, a source, and a drain and logically forming part of a driver; and electrically connecting the first gate driver HEMT to the gate of the power HEMT so that the first gate driver HEMT is operable to turn the power HEMT off or on responsive to an externally-generated control signal received from the driver or other device.

According to another embodiment of a semiconductor die, the semiconductor die comprises a III-nitride semiconductor substrate, a power HEMT disposed in the III-nitride semiconductor substrate, and a gate voltage protection circuit monolithically integrated with the power HEMT in the III-nitride semiconductor substrate. The gate voltage protection circuit is operable to limit the voltage applied to the gate of the power HEMT to below a maximum rated gate voltage of the power HEMT.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

According to embodiments described herein, at least part of a gate driver is monolithically integrated with a power HEMT on the same die. Such an integrated structure eliminates much of the parasitic inductance seen by the gate of the power HEMT, reducing voltage spikes at the gate of the power HEMT. In the case of a DC-DC converter, one, more or all of the stages of the converter driver can be integrated in the output stage die that contains power HEMTs. The converter driver stages can also be copied or partly integrated, meaning they also still appear in the driver die. Other parts of the driver can be disposed in a separate die. In general, the part of the driver integrated with the power HEMTs functions as a gate voltage protection circuit that limits the voltage applied to the gate of at least one of the power HEMTs to below the maximum rated gate voltage of that HEMT. In the case of a DC-DC converter with at least part of the last driver stage monolithically integrated with power HEMTs, the DC-DC converter has decreased dead time and increased frequency. Also, induced turn-on of the power HEMTs is avoided.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor device incorporating a junction between two materials with different band gaps (i.e., a heterojunction) as the channel. For example, GaN may be combined with AlGaN or InGaN to form the channel. The compound semiconductor device may have AlInN/AlN/GaN barrier/spacer/buffer layer structures.

Specifically with regard to GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas, such as a 2DEG (two-dimensional electron gas) or 2DHG (two-dimensional hole gas), forms a conductive channel region of an HEMT near the interface between, e.g., a GaN alloy barrier region and a GaN buffer region. A thin, e.g. 1-2 nm, AlN layer can be provided between the GaN buffer region and the GaN alloy barrier region to minimize alloy scattering and enhance 2DEG mobility. In a broad sense, the HEMTs described herein can be formed from any binary or ternary III-nitride compound semiconductor material where a band discontinuity is responsible for the device concept.

Figure 1:
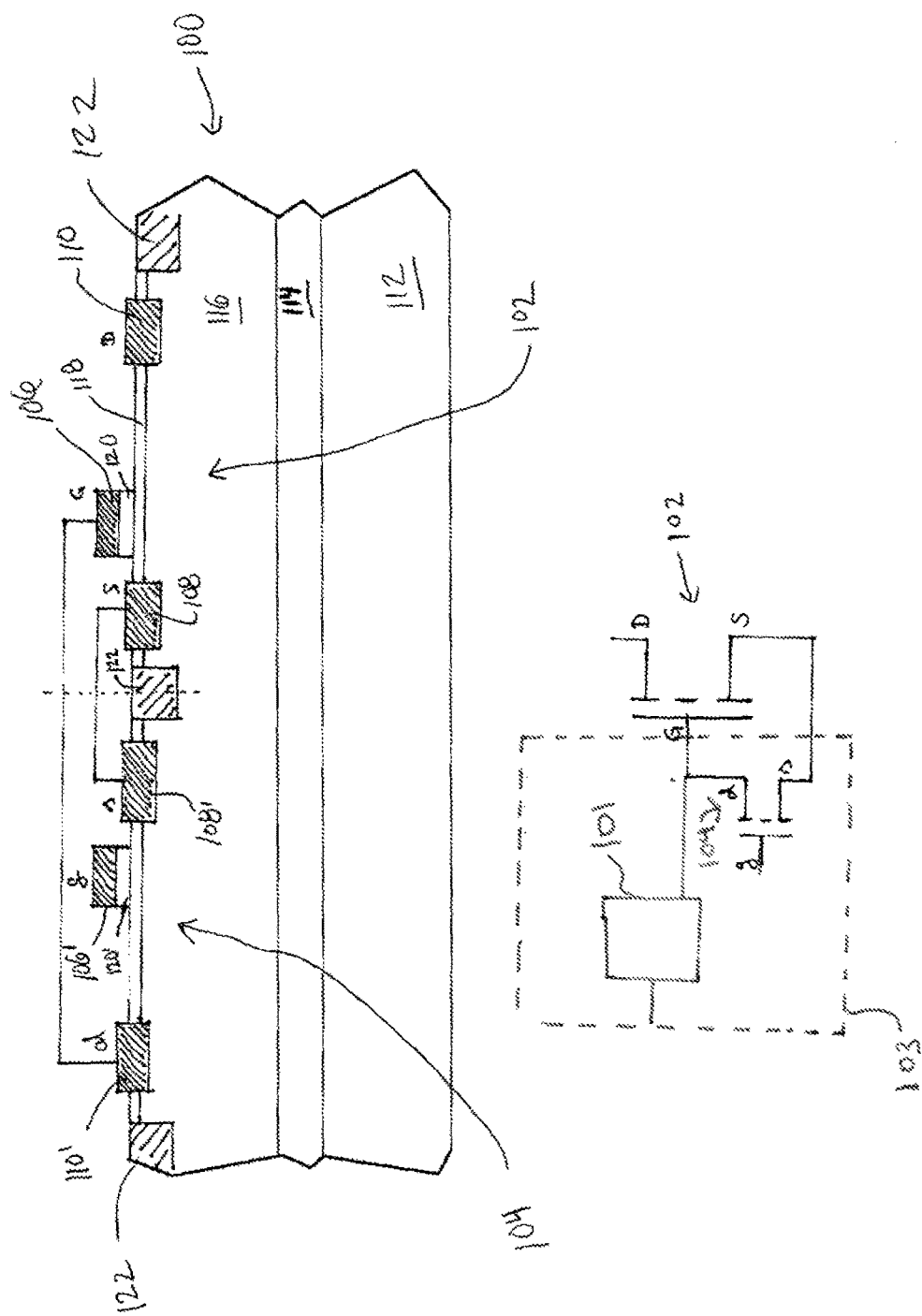
FIG. 1 illustrates a partial cross-sectional view of an embodiment of a pull-down gate driver HEMT monolithically integrated with a power HEMT in the same semiconductor die, and a corresponding circuit schematic.

Turning now to a particular embodiment, FIG. 1 illustrates a partial cross-sectional view of a semiconductor die (chip) and a corresponding circuit schematic. The die includes a III-nitride semiconductor substrate 100, a power HEMT 102 disposed in the III-nitride semiconductor substrate 100 and having a gate (G), a source (S), and a drain (D), and a gate driver HEMT 104 monolithically integrated with the power HEMT 102 in the same III-nitride semiconductor substrate 100 and also having a gate (g), a source (s), and a drain (d). Gate, source, and drain regions 106/106', 108/108', 110/110' of the HEMTs 102, 104 can comprise doped regions, e.g. silicon-doped regions in GaN-based III-nitride materials to yield n-type doping, metal regions, or a combination of doped and metal regions. The same processes can be used, but do not necessarily have to be used, to fabricate both the power HEMT 102 and the gate driver HEMT 104 on the same die. Formation of gate, source, and drain regions of HEMTs is well known in the semiconductor arts, and therefore no further explanation is provided in this regard.

The III-nitride semiconductor substrate 100 can include a growth wafer 112 such as a silicon wafer with a <111> crystal orientation, one or more transition layers 114 such as a AlN on the growth wafer 110, a buffer region 116 such as GaN on the one or more transition layers 114, and a barrier region 118 such as a GaN alloy like AlGaN or InGaN on the buffer region 116. In general, any suitable binary or ternary III-nitride compound semiconductor layers 114, 116, 118 can be formed on the growth wafer 112 for device fabrication purposes. Formation of such III-nitride compound semiconductor layers on a growth wafer is well known in the semiconductor arts, and therefore no further explanation is provided in this regard. The III-nitride semiconductor substrate 100 can include the growth wafer 112 after such device fabrication processing, or the growth wafer 112 can be removed.

In one embodiment, the gate driver HEMT 104 monolithically integrated with the power HEMT 102 is a pull-down transistor that logically forms part of a final driver stage. The power HEMT 102 can be a low-side or corresponding high-side transistor of an output stage of a DC-DC converter. The driver controls switching of the output stage of the DC-DC converter. The part of the driver not monolithically integrated with the power HEMT 102 (e.g., the pull-up transistor of the last driver stage, other stages of the driver, control logic, etc.) is disposed in a different die. FIG. 1 schematically depicts an exemplary pull-up transistor 101 as forming one part of a driver 103 that is not monolithically integrated with the power HEMT 102. The terms 'pull-up' and 'pull-down' as used herein depend on the type of power HEMT being driven. In the case of a normally-off power HEMT, a pull-up gate driver transistor pulls the gate of the power HEMT to a positive voltage and a pull-down gate driver transistor pulls the gate to zero volts to drive the normally-off power HEMT. In the case of a normally-on power HEMT, the pull-up gate driver transistor pulls the gate of the power HEMT to a negative voltage and the pull-down gate driver transistor pulls the gate to zero volts to drive the normally-on power HEMT.

This driver die and the other power transistor 101 of the DC-DC converter output stage are schematically illustrated in FIG. 1. The other power transistor 101 of the DC-DC converter output stage can be integrated in the same or different die as the power HEMT shown in FIG. 1. The DC-DC converter can have one output stage (single-phase) or multiple output stages (multi-phase), each stage having a high-side power HEMT and a low-side power HEMT. Those skilled in the art will readily appreciate that other parts of the driver can be monolithically integrated on the same die as the power HEMT 102 shown in FIG. 1, e.g. the pull-up transistor of the last driver stage (as described in more detail later herein), other stages of the driver, driver control logic, etc. One or more driver stage transistors for the other HEMT of the DC-DC converter output stage similarly can be monolithically integrated on the same die as that power HEMT. The embodiments described herein pertaining to the integration of driver stage HEMT(s) with power HEMTs of a DC-DC converter output stage equally apply to both low-side and corresponding high-side transistors of the converter.

With this understanding, the pull-down gate driver HEMT 104 is electrically connected to the gate (G) of the power HEMT 102. In one embodiment, the drain (d) of the pull-down gate driver HEMT 104 is electrically connected to the gate (G) of the power HEMT 102, and the source (s) of the pull-down gate driver HEMT 104 is electrically connected to the source (S) of the power HEMT 102. The pull-down gate driver HEMT 104 is operable to turn the power HEMT 102 off responsive to an externally-generated control signal received from the driver or other device and applied to the gate (g) of the pull-down HEMT 104.

The pull-down gate driver HEMT 104 and the power HEMT 102 are normally-off devices in FIG. 1. A normally-off HEMT can be realized, e.g. by forming a p-GaN, InGaN, or silicon oxide region 120/120' between the gate of the respective HEMTs 102, 104 and the underlying barrier region 118. Such a construction ensures the channel of the HEMTs 102, 104 is disrupted under the respective gates under no gate bias. Alternatively, normally-on HEMTs can be used by removing the intermediary layer 120/120' between the gate and the barrier region 118. The channel of a normally-on HEMT is uninterrupted under the gate when no bias voltage is applied to the gate. A normally-on HEMT can be turned off by applying a negative potential to the gate of the HEMT. In either case, the power HEMT 102 can be separated from the pull-down gate driver HEMT 104 by an isolation region 122, such as an implanted region or dielectric region disposed in a trench formed in the III-nitride semiconductor substrate 100.

Figure 2:
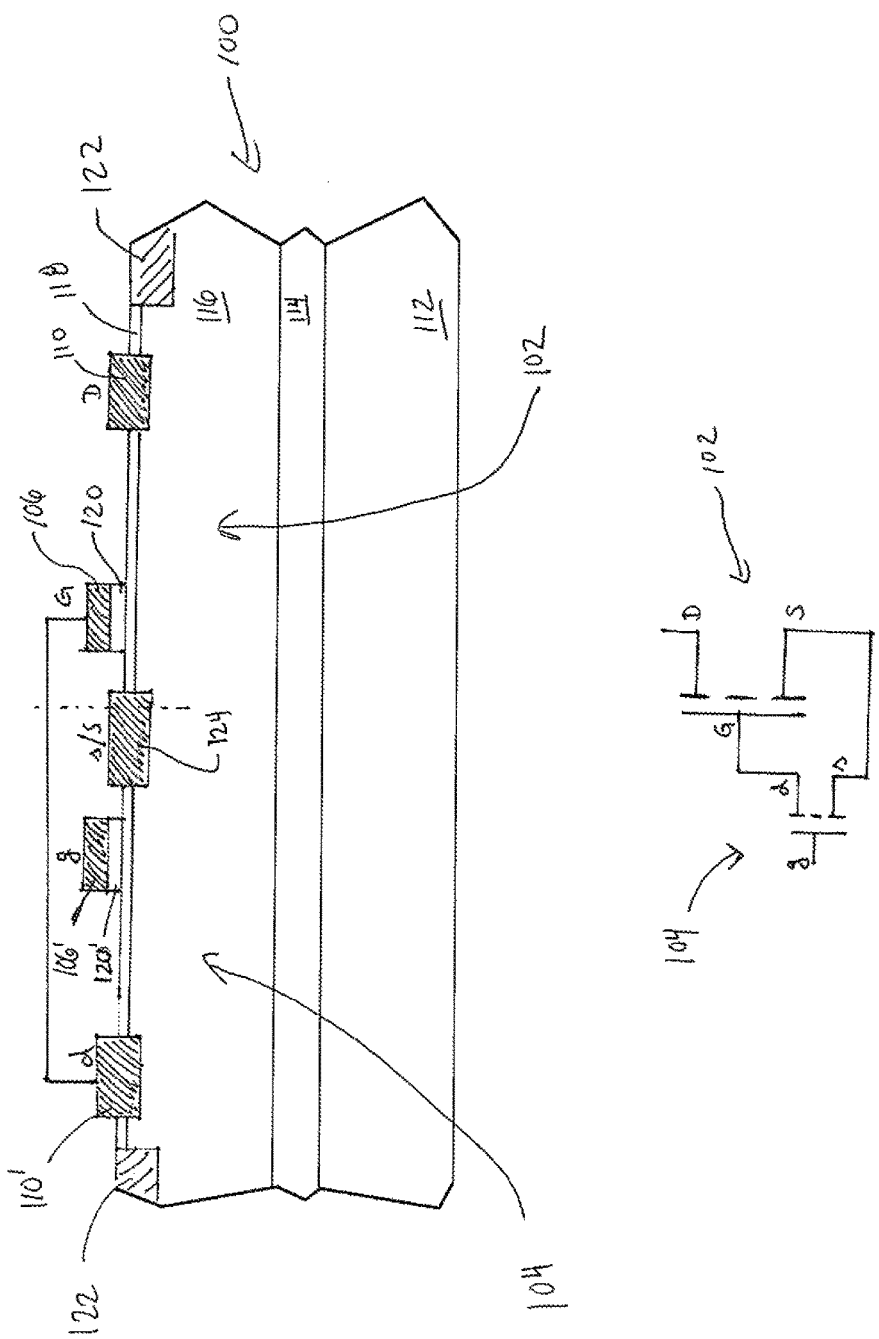
FIG. 2 illustrates a partial cross-sectional view of another embodiment of a pull-down gate driver HEMT monolithically integrated with a power HEMT in the same semiconductor die, and a corresponding circuit schematic.

FIG. 2 illustrates a partial cross-sectional view of another embodiment of the semiconductor die and corresponding circuit schematic. The die shown in FIG. 2 is similar to the one shown in FIG. 1, however the power HEMT 102 and the pull-down gate driver HEMT 104 share a common source region 124 disposed in the III-nitride semiconductor substrate 100.

Figure 3:
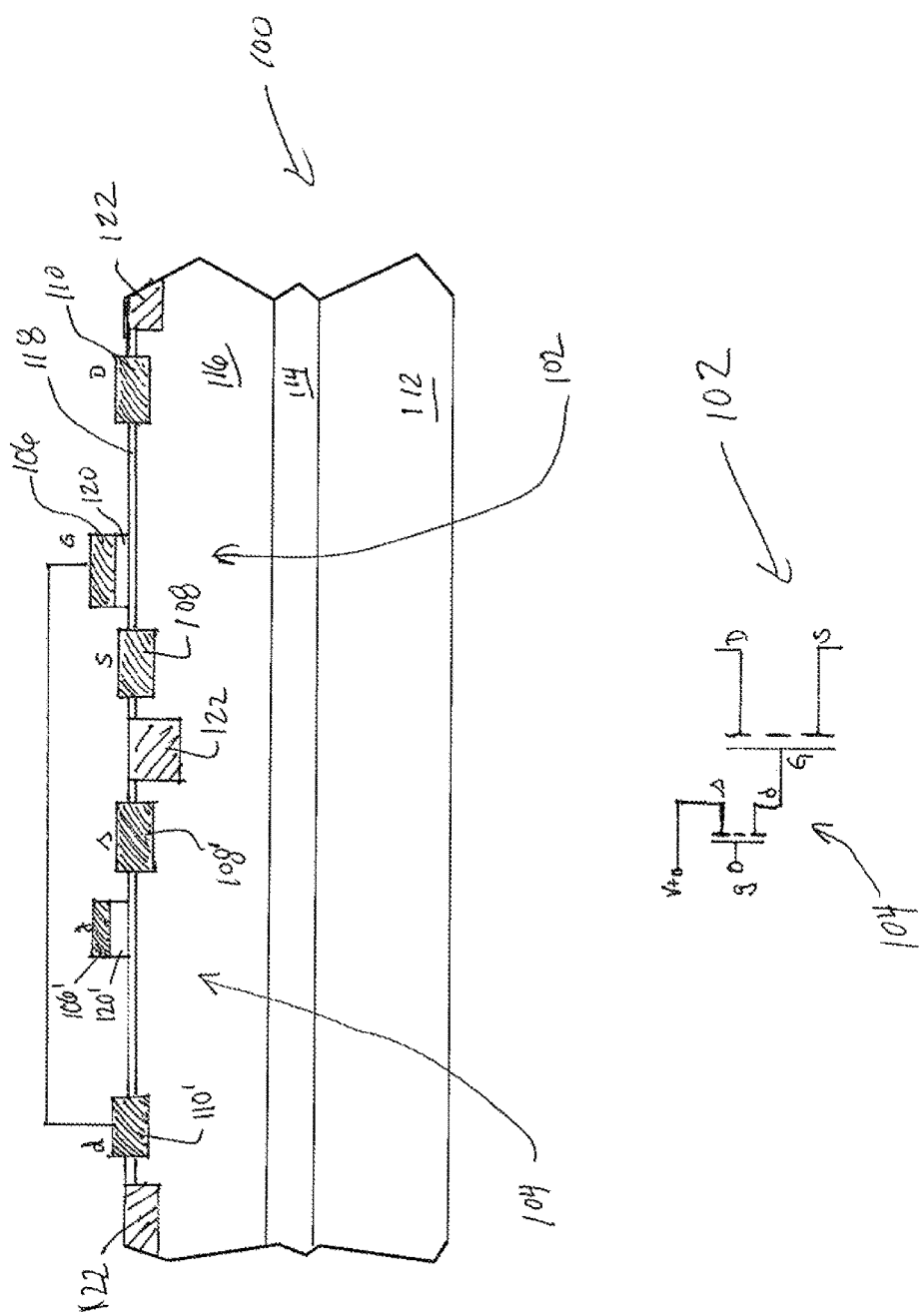
FIG. 3 illustrates a partial cross-sectional view of an embodiment of a pull-up gate driver HEMT monolithically integrated with a power HEMT in the same semiconductor die, and a corresponding circuit schematic.

FIG. 3 illustrates a partial cross-sectional view of yet another embodiment of the semiconductor die. The die shown in FIG. 3 is similar to the one shown in FIG. 1, however, the gate driver HEMT 104 is a pull-up transistor with the drain (d) of the pull-up gate driver HEMT 104 electrically connected to the gate (G) of the power HEMT 102, and the source (s) of the pull-up gate driver HEMT 104 electrically connected to a supply voltage (V). In the case of the power HEMT 102 and the pull-up gate driver HEMT 104 both being normally-off devices as illustrated in FIG. 3, the supply voltage electrically connected to the source (s) of the pull-up gate driver HEMT 104 is a positive supply voltage (V+). In another embodiment, the power HEMT 102 and pull-up gate driver HEMT 104 are both normally-off and the supply voltage electrically connected to the source (s) of the pull-up gate driver HEMT 104 is negative. In each case, the pull-up gate driver HEMT 104 is operable to turn the power HEMT 102 on responsive to an externally-generated control signal applied to the gate (g) of the pull-up gate driver HEMT 104.

Figure 4:
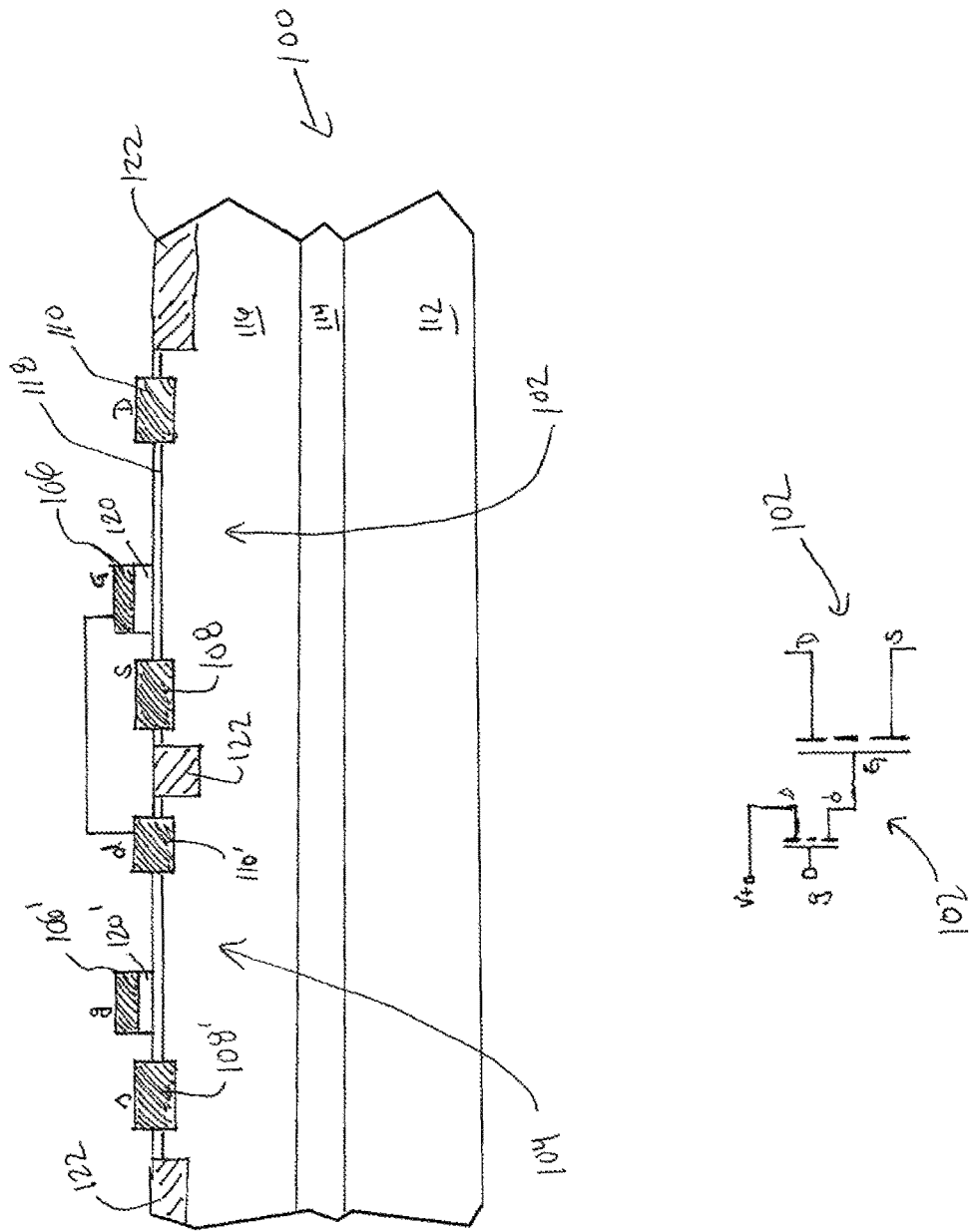
FIG. 4 illustrates a partial cross-sectional view of another embodiment of a pull-up gate driver HEMT monolithically integrated with a power HEMT in the same semiconductor die, and a corresponding circuit schematic.

FIG. 4 illustrates a partial cross-sectional view of still another embodiment of the semiconductor die and corresponding circuit schematic. The die shown in FIG. 4 is similar to the one shown in FIG. 3, however, the position of the source (s) and drain (d) of the pull-up gate driver HEMT 104 is reversed with reference to the source (S) of the power HEMT 102, so that the drain-to-gate electrical connection between the HEMTs 102, 104 is shorter, further reducing parasitic loading of the power HEMT gate (G).

Figure 5:
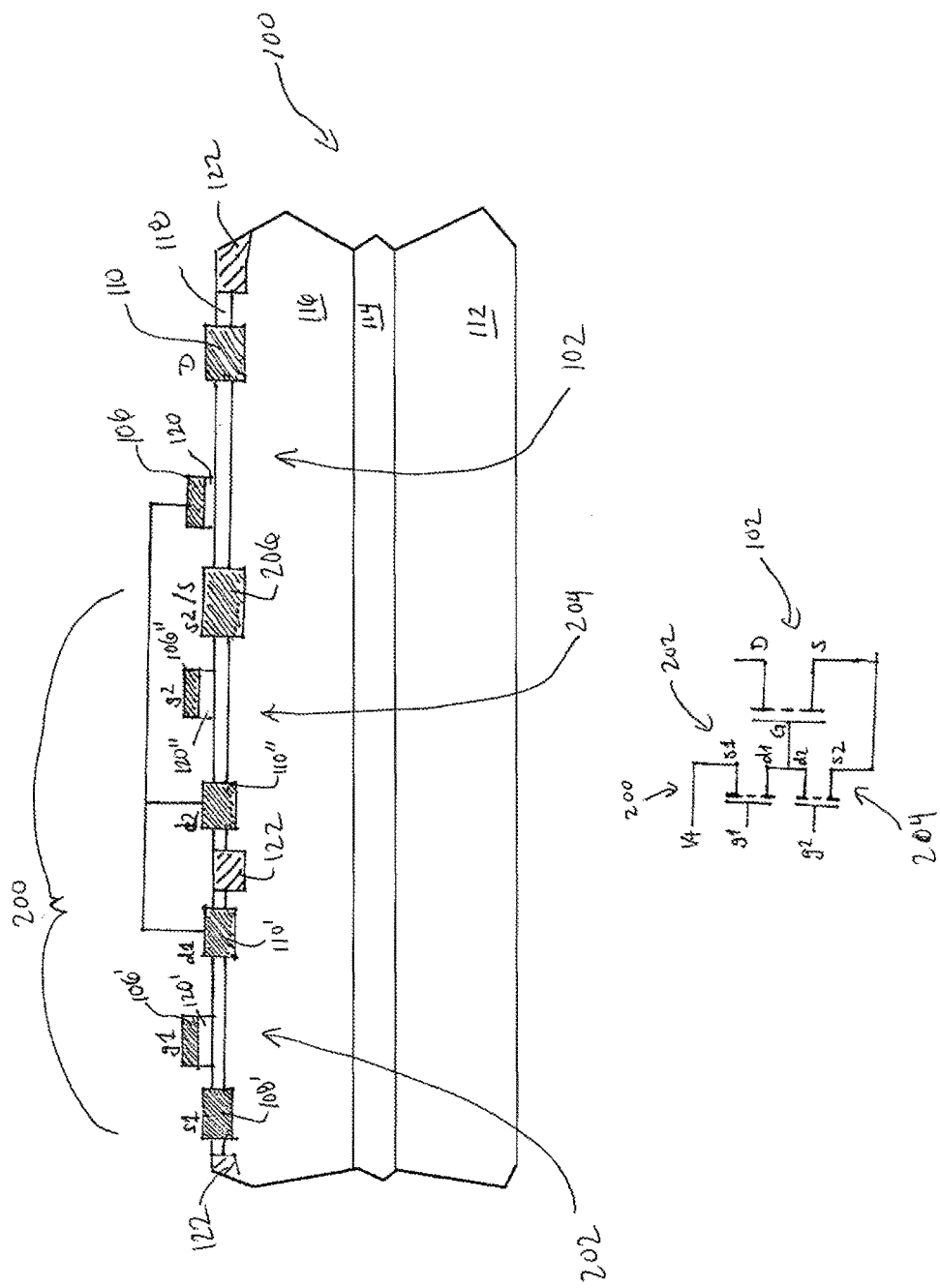
FIG. 5 illustrates a partial cross-sectional view of an embodiment of an HEMT-based final gate driver stage monolithically integrated with a power HEMT in the same semiconductor die, and a corresponding circuit schematic.

FIG. 5 illustrates a partial cross-sectional view of yet another embodiment of a semiconductor die and corresponding circuit schematic. The die includes a III-nitride semiconductor substrate 100, a power HEMT 104 disposed in the III-nitride semiconductor substrate 100, and an entire final gate driver stage 200 monolithically integrated with the power HEMT 102 in the III-nitride semiconductor substrate 100. Additional driver stage(s) behind the final drive stage can also be monolithically integrated with the power HEMT 102. There is no limitation on the number of driver stage cascodes that can be monolithically integrated with the power HEMT 102. If all of the driver stages for the power HEMT 102 are integrated on the same die as the power HEMT 102, these parts can be completely removed from the driver. This in turn can allow for the use of a different driver voltage class. Depending on whether the driver is provided to drive the high-side and/or low-side of a DC-DC converter power HEMT, additional transistors can be provided to block higher voltages. These voltage blocking transistors can all be high ohmic in nature. Also, these voltage blocking devices can be integrated on the same die as the power HEMT 102.

Further according to the embodiment illustrated in FIG. 5, the final gate driver stage 200 includes a pull-up gate driver HEMT 202 and a pull-down gate driver HEMT 204. The pull-up and pull-down gate driver HEMTs 202, 204 each have a gate 106', 106'', source 108', 108'' and drain 110', 110''. The pull-up and pull-down gate driver HEMTs 202, 204 logically form part of the same driver and are operable to turn the power HEMT 104 on or off responsive to corresponding externally-generated control signals (g1, g2) received from an external driver die or controller.

In one embodiment, the pull-up gate driver HEMT 202 is separated from the power HEMT 102 and the pull-down gate driver HEMT 204 by an isolation region 122 disposed in the III-nitride semiconductor substrate 100, and the power HEMT 102 and the pull-down gate driver HEMT 204 share a common source region 206 disposed in the III-nitride semiconductor substrate 100, as shown in FIG. 5. In addition, or alternatively, the pull-up gate driver HEMT 202 and the pull-down gate driver HEMT 204 can similarly share a common drain region disposed in the III-nitride semiconductor substrate 100 which is electrically connected to the gate (G) of the power HEMT 102. According to this embodiment, the isolation region 122 between the pull-up and pull-down gate driver HEMTs 202, 204 is omitted and the drains (d1, d2) of the gate driver HEMTs 202, 204 are realized as a single, common drain region in the III-nitride semiconductor substrate 100. Further according to the embodiment illustrated in FIG. 5, both gate driver HEMTs 202, 204 and the power HEMT 102 are each normally-off devices e.g. the HEMT gates 110, 110', 110'' are separated from the barrier region 118 by a respective p-GaN, InGaN, or silicon oxide region 120, 120', 120''. As such, the supply voltage (V) electrically connected to the source (s1) of the pull-up gate driver HEMT 202 is positive (V+).

Figure 6:
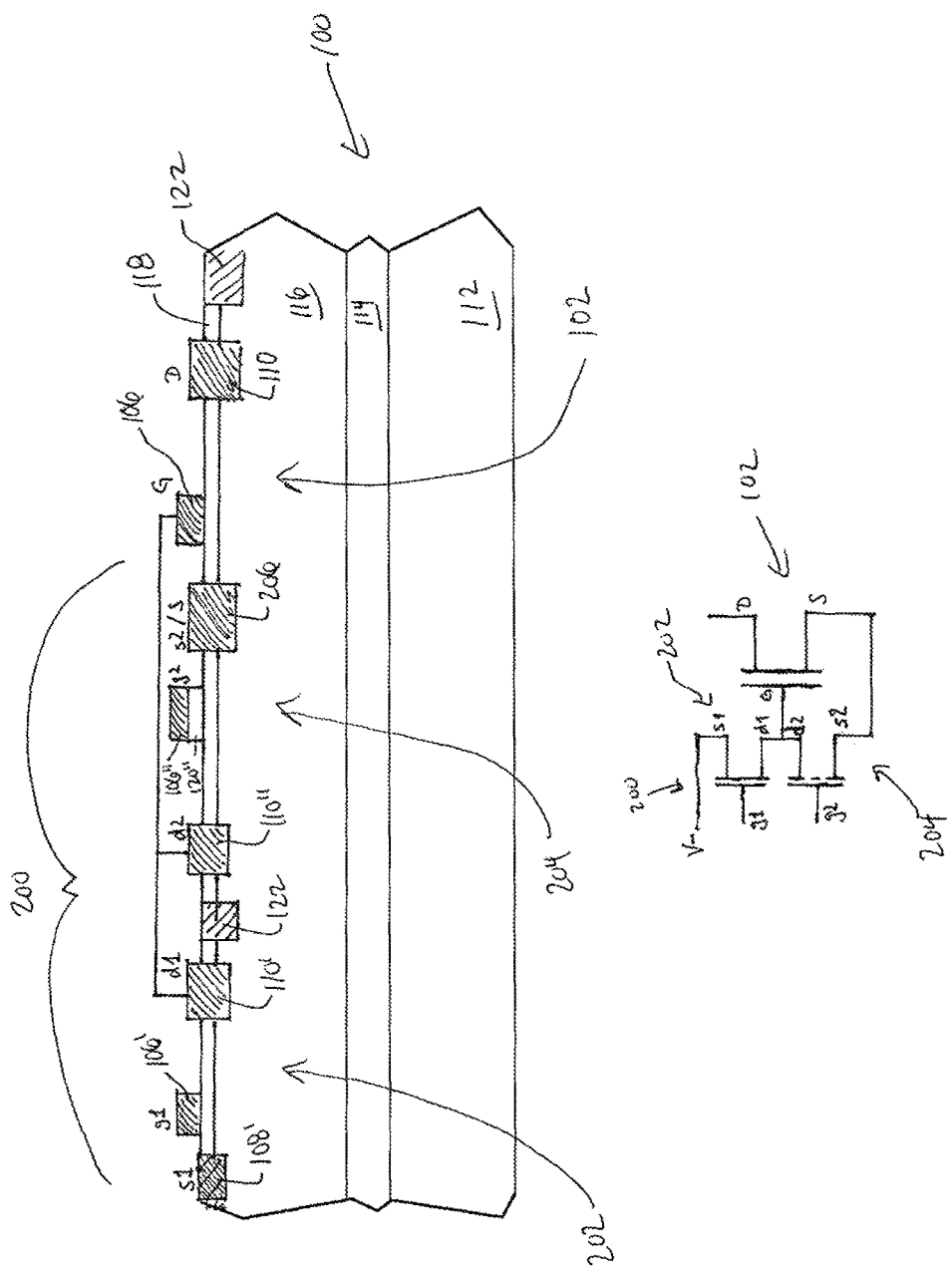
FIG. 6 illustrates a partial cross-sectional view of another embodiment of an HEMT-based final gate driver stage monolithically integrated with a power HEMT in the same semiconductor die, and a corresponding circuit schematic.

FIG. 6 illustrates a partial cross-sectional view of another embodiment of the semiconductor die and corresponding circuit schematic. The die shown in FIG. 6 is similar to the one shown in FIG. 5, however the power HEMT 102 and the pull-up gate driver HEMT 202 are normally-on, and the pull-down gate driver HEMT 204 is normally-off. According to this embodiment, the drain (d1, d2) of the pull-up and pull-down gate driver HEMTs 202, 204 are electrically connected to the gate (G) of the power HEMT 102, the source (s2) of the pull-down gate driver HEMT 202 is electrically connected to the source (S) of the power HEMT 102, and the source (s1) of the pull-up gate driver HEMT 202 is electrically connected to a negative supply voltage (V−).

If a negative supply voltage (V−) is permanently provided, there is no risk in using normally-on HEMTs, e.g., as shown in FIG. 6. Only the pull-down gate driver HEMT 204 needs to be normally-off in this case. The pull-up gate driver HEMT 202 can be normally-on, thereby automatically shortening the gate of the power HEMT 102 by the negative supply voltage (V−). The area increase and efficiency decrease when going to such a safer solution is thus minimized. Of course only parts of the final gate drive stage 200 or additional driver stages for the power HEMT 102 can be monolithically integrated on the same die with the power HEMT 102, as previously explained herein.

Figure 7:
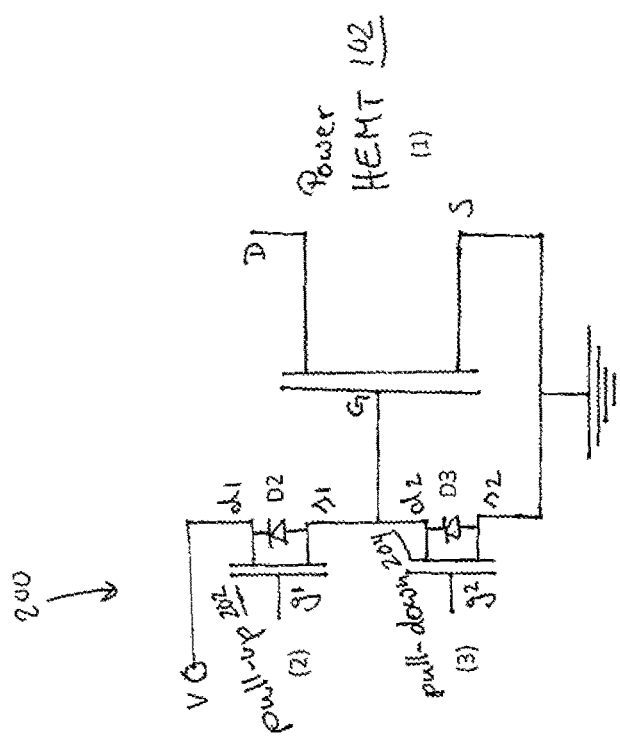
FIG. 7 illustrates a schematic diagram of an exemplary HEMT-based final gate driver stage monolithically integrated with a power HEMT.

As mentioned previously herein, the supply voltages (V) used in the semiconductor die depend at least partly on the type of HEMTs employed, i.e., normally-on or normally-off. FIG. 7 illustrates a circuit schematic of the final stage 200 of a driver monolithically integrated with a power HEMT 102(1). The final driver stage 200 includes a pull-up HEMT 202(2) and a pull-down HEMT 204(3). In addition to the transistor-type based supply voltage considerations previously described herein, the driver stage HEMTs 202, 204 each have a diode (D2, D3) which can present problems for the power HEMT 102 under certain conditions.

The supply voltage (V) applied to the source (s1) of the pull-up gate driver HEMT 202 and the control signals applied to the gates (g1, g2) of the gate driver HEMTs 202, 204 can be determined based on the type of HEMTs employed in the circuit to mitigate any adverse effects associated with the diodes and ensure proper operation of the power HEMT 102. Table 1 below provides a matrix of control signal and supply voltage magnitudes as a function of different transistor type combinations. In Table 1, 'V' represents the supply voltage applied to the source (s1) of the pull-up gate driver HEMT 202, G2 represents the control signal applied to the gate of the pull-up gate driver HEMT 202, G3 represents the control signal applied to the gate of the pull-down gate driver HEMT 204, 'D2' represents the diode between the source (s1) and drain (d1) of the pull-up gate driver HEMT 202, 'D3' represents the diode between the source (s2) and drain (d2) of the pull-down gate driver HEMT 204, 'F1' indicates the power HEMT 102 is a normally-off device, 'N1' indicates the power HEMT 102 is a normally-on device, 'F2' indicates the pull-up gate driver HEMT 202 is a normally-off device, 'N2' indicates the pull-up gate driver HEMT 202 is a normally-on device, 'F3' indicates the pull-down gate driver HEMT 204 is a normally-off device, 'N3' indicates the pull-down gate driver HEMT 204 is a normally-on device, 'N' indicates the corresponding diode (D2/D3) is non-conducting, and 'Y' indicates the corresponding diode (D2/D3) is conducting. In general, the diodes of the driver stage HEMTs 202, 204 can be problematic (i.e. conducting), but this depends also on the threshold voltage of the HEMT. If the threshold voltage is well adjusted so that the diodes are not conducting exactly when it would be problematic for the gate of the power HEMT 202, the diodes becomes less of a concern and the corresponding diode mitigation techniques described herein may not be needed.

TABLE 1

HEMT Control Signal and Supply Voltage Conditions

| | F1 | | | | N1 | | | |
| --- | --- | --- | --- | --- | --- | --- | --- | --- |
| | F2F3 | F2N3 | N2F3 | N2N3 | F2F3 | F2N3 | N2F3 | N2N3 |
| V | >0 | >0 | >0 | >0 | <0 | <0 | <0 | <0 |
| G2 | ≥V | ≥V | ≤V | ≤V | ≥V | ≥V | ≤V | ≤V |
| G3 | ≥0 | ≤0 | ≥0 | ≤0 | ≥0 | ≤0 | ≥0 | ≤0 |
| D2 | N | N | N | N | Y | Y | Y | Y |
| D3 | Y | Y | Y | Y | N | N | N | N |

Diode D2 becomes problematic when V is smaller than 0V (plus a margin equal to the threshold voltage). In one embodiment, adverse effects associated with the diodes of the driver stage HEMTs 202, 204 can be mitigated to ensure proper operation of the power HEMT 102 by changing the position of the source and drain of the gate driver HEMT 202/204 where the diode is a problem. However, doing so requires changing the control signal for that gate driver HEMT 202/204. In another embodiment, the gate driver HEMT 202/204 where the diode is a problem is switched off hard enough to ensure proper operation of the HEMT. An HEMT becomes conducting when the drain-gate voltage exceeds the threshold voltage of the HEMT. In the case of a normally-on HEMT, the conducting point already occurs at 0V. With reference to Table 1, in the cases of 'N1F2F3' and 'N1N2F3', the pull-down gate driver HEMT 204 can be switched off hard enough by using a negative control voltage G3 e.g. when the absolute voltage (Vsupply) is too high this voltage on the gate of the driving transistor can be too high if left unmitigated. Choosing the gate control voltage carefully defines the voltage where the problematic diode switches on. By setting the gate control voltage to a proper voltage, every spike on the gate (G) of the power HEMT 102 can be canceled. In some circuits this may mean that the gate driver HEMTs 202, 204 are driven with different voltages than the power HEMT 102 even if all of the HEMTs 102, 202, 204 are of the same type (normally-off or normally-on). In addition or alternatively, the construction of one or more of the HEMTs 102, 202, 204 can be modified to adjust threshold voltage or maximum gate voltage of those devices.

According to an embodiment of a method of manufacturing the semiconductor die described herein, the method comprises: forming a power HEMT in a III-nitride semiconductor substrate, the power HEMT having a gate, a source and a drain; monolithically integrating a first gate driver HEMT with the power HEMT in the III-nitride semiconductor substrate, the first gate driver HEMT having a gate, a source and a drain and logically forming part of a driver; and electrically connecting the first gate driver HEMT to the gate of the power HEMT so that the first gate driver HEMT is operable to turn the power HEMT off or on responsive to an externally-generated control signal received from the driver or controller. The method can further comprise forming an isolation region in the III-nitride semiconductor substrate that separates the power HEMT from the first gate driver HEMT. In the case the first gate driver HEMT is a pull-down transistor, the method can further comprise electrically connecting the drain of the first gate driver HEMT to the gate of the power HEMT and electrically connecting the source of the first gate driver HEMT to the source of the power HEMT. In the case the first gate driver HEMT is a pull-up transistor, the method can further comprise electrically connecting the drain of the first gate driver HEMT to the gate of the power HEMT and electrically connecting the source of the first gate driver HEMT to a supply voltage. In the case of a monolithically integrated complete final gate driver stage, the method can further comprise monolithically integrating the other (second) gate driver HEMT with the power HEMT and the first gate driver HEMT in the III-nitride semiconductor substrate and electrically connecting the second gate driver HEMT to the gate of the power HEMT so that the second gate driver HEMT is operable to turn the power HEMT on or off responsive to an additional externally-generated control signal received from the driver or controller.

In a broad sense, each of the monolithically integrated gate driver HEMTs described herein function as a gate voltage protection circuit that limits the voltage applied to the gate of the power HEMT to below the maximum rated gate voltage of the power HEMT. In the case of a DC-DC converter with at least part of the gate driver monolithically integrated with a power HEMT, such an integrated construction yields a DC-DC converter with decreased dead time, increased frequency, and no induced turn-on of the power HEMT.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor die, comprising:
   a III-nitride semiconductor substrate;
   a power HEMT (high-electron-mobility transistor) disposed in the III-nitride semiconductor substrate and having a gate, a source and a drain; and
   a first gate driver HEMT monolithically integrated with the power HEMT in the III-nitride semiconductor substrate and having a gate, a source and a drain, the first gate driver HEMT logically forming part of a driver and being electrically connected to the gate of the power HEMT and operable to turn the power HEMT off or on responsive to an externally-generated control signal received from the driver or other device,
   wherein the drain of the first gate driver HEMT is electrically connected to the gate of the power HEMT, and
   wherein another part of the driver that the first gate driver logically forms a part of is disposed in a die that is separate from the power HEMT and the first gate driver.

2. The semiconductor die of claim 1, wherein the power HEMT is separated from the first gate driver HEMT by an isolation region disposed in the III-nitride semiconductor substrate.

3. The semiconductor die of claim 1, wherein the power HEMT and the first gate driver HEMT share a common source region disposed in the III-nitride semiconductor substrate.

4. The semiconductor die of claim 1, wherein the power HEMT and the first gate driver HEMT are normally-off.

5. The semiconductor die of claim 1, wherein the power HEMT is normally-on and the first gate driver HEMT is normally-off.

6. The semiconductor die of claim 1, wherein the source of the first gate driver HEMT is electrically connected to the source of the power HEMT.

7. The semiconductor die of claim 1, wherein the source of the first gate driver HEMT is electrically connected to a supply voltage.

8. The semiconductor die of claim 7, wherein the power HEMT is normally-on and the supply voltage is negative.

9. The semiconductor die of claim 1, further comprising a second gate driver HEMT monolithically integrated with the power HEMT and the first gate driver HEMT in the III-nitride semiconductor substrate and having a gate, a source and a drain, the second gate driver HEMT logically forming part of the same driver as the first date driver HEMT and being electrically connected to the gate of the power HEMT and operable to turn the power HEMT on or off responsive to an additional externally-generated control signal received from the driver that the first gate driver logically forms a part of or other device.

10. The semiconductor die of claim 9, wherein the power HEMT and the first gate driver HEMT share a common source region disposed in the III-nitride semiconductor substrate.

11. The semiconductor die of claim 9, wherein the first gate driver HEMT and the second gate driver HEMT share a common drain disposed in the III-nitride semiconductor substrate which is electrically connected to the gate of the power HEMT.

12. The semiconductor die of claim 9, wherein the second gate driver HEMT is separated from the power HEMT and the first gate driver HEMT by an isolation region disposed in the III-nitride semiconductor substrate.

13. The semiconductor die of claim 9, wherein the power HEMT and the second gate driver HEMT are normally-on and the first gate driver HEMT is normally-off.

14. The semiconductor die of claim 13, wherein the drain of the first and second gate driver HEMTs are electrically connected to the gate of the power HEMT, the source of the first gate driver HEMT is electrically connected to the source of the power HEMT, and the source of the second gate driver HEMT is electrically connected to a negative supply voltage.

15. A semiconductor die, comprising:
   a III-nitride semiconductor substrate;
   a power HEMT (high-electron-mobility transistor) disposed in the III-nitride semiconductor substrate, the power HEMT having a maximum rated gate voltage; and
   a gate voltage protection circuit comprising a transistor that is monolithically integrated with the power HEMT in the III-nitride semiconductor substrate, the gate voltage protection circuit operable to limit the voltage applied to the gate of the power HEMT to below the maximum rated gate voltage responsive to an externally-generated control signal received at an input terminal of the transistor,
   wherein the gate voltage protection circuit logically forms part of a driver circuit, and
   wherein another part of the driver circuit is disposed in a die that is separate from the power HEMT and the first gate driver.

* * * * *